United States Patent [19]
Watanabe

[11] Patent Number: 4,584,674
[45] Date of Patent: Apr. 22, 1986

[54] SEMICONDUCTOR MEMORY DEVICE WITH IMPROVED MEMORY ARRANGEMENT

[75] Inventor: Hiroshi Watanabe, Tokyo, Japan

[73] Assignee: NEC Corporation, Tokyo, Japan

[21] Appl. No.: 552,221

[22] Filed: Nov. 16, 1983

[30] Foreign Application Priority Data

Nov. 16, 1982 [JP] Japan .................................. 57-200553

[51] Int. Cl.⁴ ............................................... G11C 8/00
[52] U.S. Cl. ................................................... 365/230
[58] Field of Search ............................. 365/189, 230

[56] References Cited

U.S. PATENT DOCUMENTS 4,369,503 1/1983 Isogai .................................... 365/189
4,429,374 1/1984 Tanimura ............................. 365/230

Primary Examiner—Joseph A. Popek
Attorney, Agent, or Firm—Sughrue, Mion, Zinn, Macpeak, and Seas

[57] ABSTRACT

A semiconductor memory device which is hardly affected by short-circuiting between word lines and can be fabricated with a high integration density is disclosed. The memory device is featured in that a plurality of word lines are assigned to each decoder in common via plurality of selection circuits and each adjacent word lines are connected to different decoders.

13 Claims, 3 Drawing Figures

SEMICONDUCTOR MEMORY DEVICE WITH IMPROVED MEMORY ARRANGEMENT

BACKGROUND OF THE INVENTION

The present invention relates to a semiconductor memory device, and more particularly, to a decoder circuit in the memory device.

The storage capacity of semiconductor memory devices becomes greater and greater in recent developments, and efforts are being made to increase the integration density of the integrated circuit chip without increasing the chip area through the development of techniques of miniaturizing functional elements, wiring and so forth.

It is, however, apparent from practical experiences that an increase in the storage capacity inevitably causes an increase in chip area. Owing to the miniaturization and the increase in the chip area, the chip yield of the memory device has been remarkably reduced. A considerable number of defects in the semiconductor memory device which cause the chip yield reduction are attributable to the failure of memory cells of bits which account for not larger than 1% of the whole memory bits, such as the failure of one to several bits or the failure of one to several words.

As measures to salvage such a failure, there are known a redundancy arrangement that a chip is provided with a spare memory array for replacing any defective bits thereby, and a method (mostly good) that utilizes the greater part of operative bits while eliminating some defective bits. The conventional memory, however, cannot efficiently realize the above-mentioned saving methods. The reasons for this are attributable to various restrictions imposed for attaining a memory of great storage capacity.

First of all, one-transistor type cells are usually employed for such a large-capacity memory, and the area per bit is small in this case. However, the cells are of dynamic type, and hence, the written information disappears when a predetermined time has elapsed. Therefore, it is necessary to execute a rewriting cycle called "refreshing" within this time. In this refreshing cycle, by accessing one word line of a memory matrix, all the memory cells connected to the one word line are simultaneously refreshed. For example, a dynamic memory of 16K bits has a memory matrix constituted by 128 rows by 128 columns. In the refreshing cycle, the rows of the matrix are accessed one by one, and all the bits of the memory matrix are refreshed by 128 accesses in total. During this refreshing cycle, the other bits cannot be accessed. Therefore, the dynamic memory is required to hold down the number of refreshing cycles, i.e., the number of rows of the memory matrix to a value smaller than a predetermined value. For example, in a memory of 64K bits, a memory matrix of 128 rows by 512 columns is constituted to prevent any increase in number of refreshing cycles. In order to prevent the chip from taking long and narrow shape in the row direction owing to the above arrangement, such an arrangement is employed that the memory matrix is divided into two parallel arrays each having 128 rows by 256 columns, and each array is provided with row decoders so that the 512 (256×2) cells in the both arrays are simultaneously refreshed by selecting one row in each array.

Moreover, one-transistor type cells have been becoming smaller in size in proportion to the increase have been in the storage capacity, and hence there occured a restriction due to the fact that layout pitches of decoders are larger than that of cells. More specifically, since it is impossible to dispose one decoder and one word line in the same direction, one decoder is allotted to a plurality of word lines through a plurality of switches, respectively, and only one of these word lines is brought to the selection level by energizing one of these switches, thereby to solve the problem of the pitch difference.

For example, in an RAM of 16K bits, two word lines are connected to one decoder through two switches, respectively, and in an RAM of 64K bits four word lines are connected to one decoder through four switches, respectively. When a plurality of word lines are led out from one decoder, the conventional physical arrangement of word lines on a memory matrix is such that the word lines coming out of the same decoder are adjacent to each other. Such an arrangement offers a disadvantage in manufacturing a memory having the above-mentioned redundancy circuits or a memory adopting the most good method.

There is an unignorable amount of failure due to short circuits between the adjacent word lines in a defective mode in which some memory cells are defective. In such a defect mode, the conventional arrangement unfavorably causes a large number of word line failures. If it is considered that short circuits occur with an equal probability between all the adjacent word lines, in the above-mentioned RAM of 64K bits, for example, $\frac{3}{4}$ of the short circuits occur between the adjacent word lines connected to the same decoder. In such a case, when either one of the adjacent word lines short-circuiting with each other in one array is in the selective state, the other word line short-circuiting with the one word line is simultaneously brought into the selective state. At this time, a current undesirably flows between two switches connected between these two word lines and the decoder, respectively, so that two control signal lines for selectively driving the two switches are simultaneously energized. Accordingly, at this time, also in the other array, two of four word lines connected to a selected decoder are erroneously selected at the same time. As a result, four word lines in total are brought into the selective state. Thus, the failure of one pair of word lines accompanies the failure of another pair of word lines disadvantageously. For this reason, it is impossible to electrically determine the two word lines short-circuiting with each other from the four word lines. Accordingly, these two pairs of word lines must be replaced with two pairs of redundancy circuits, and therefore, the conventional method is not efficient.

SUMMARY OF THE INVENTION

It is an object of the invention to provide a memory device having no possibility that any short circuit between the adjacent word lines may cause a malfunction of other normal word lines.

It is another object of the invention to provide a memory device high in yield and low in cost.

According to the present invention, a plurality of word lines are allotted to each decoder in common, and adjacent word lines on the memory matrix are connected to different decoders, respectively.

With such an arrangement that the adjacent two word lines are connected to different decoders, there is no possibility that two switches connected between the two adjacent word lines and the two different decoders, respectively, may be simultaneously driven by a decoder output. For this reason, no current will flow between selection signal lines for controlling the operation of the respective switches, so that there is no possibility of impairing the independence of the current flowing through each selection signal line. Accordingly, any short circuit between the adjacent work lines will not cause a malfunction of other normal word lines. Thus, if there is a failure of a word line, the adverse effect of the failure can be minimized, so that it is possible to easily and economically realize a memory device by employing only a normal region in the memory matrix or by replacing only the defective region with a spare region.

DESCRIPTION OF THE PREFERRED EMBODIMENT

The memory matrix arrangement of a general large-capacity memory will be described hereinunder with reference to FIG. 1. In the following description, a memory of 64K bits is taken as an example.

Figure 1:
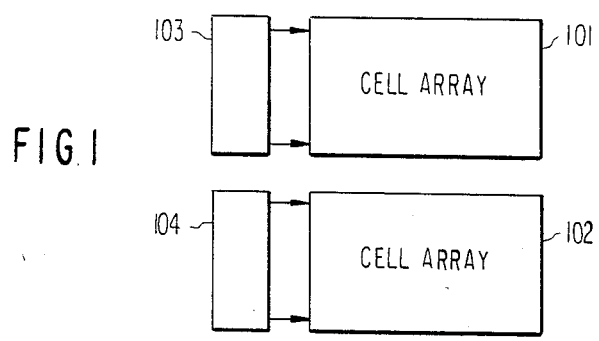
FIG. 1 shows a general memory cell arrangement of a large-capacity memory.

Referring to FIG. 1, each of memory arrays 101, and 102 has a capacity of 32K bits constituted 128 rows by 256 columns, and the memory arrays 101 and 102 are provided with row selection circuits 103 and 104, respectively. When the memory is accessed or refreshed, each of the row selection circuits 103 and 104 selects one word line of each array to select and refresh 256 cells simultaneously thereby to refresh 512 (256×2) cells as a whole. By the way, since the one-transistor cell is now small in size, there is a restriction due to the fact that decoders are larger in pitch than cells. More specifically, since it is impossible to dispose one decoder and one word line in the same line, one decoder is allotted to a plurality of word lines, and the arrangement is such that only one of these word lines is brought to the selection level, thereby to solve the problem of the pitch difference.

Figure 2:
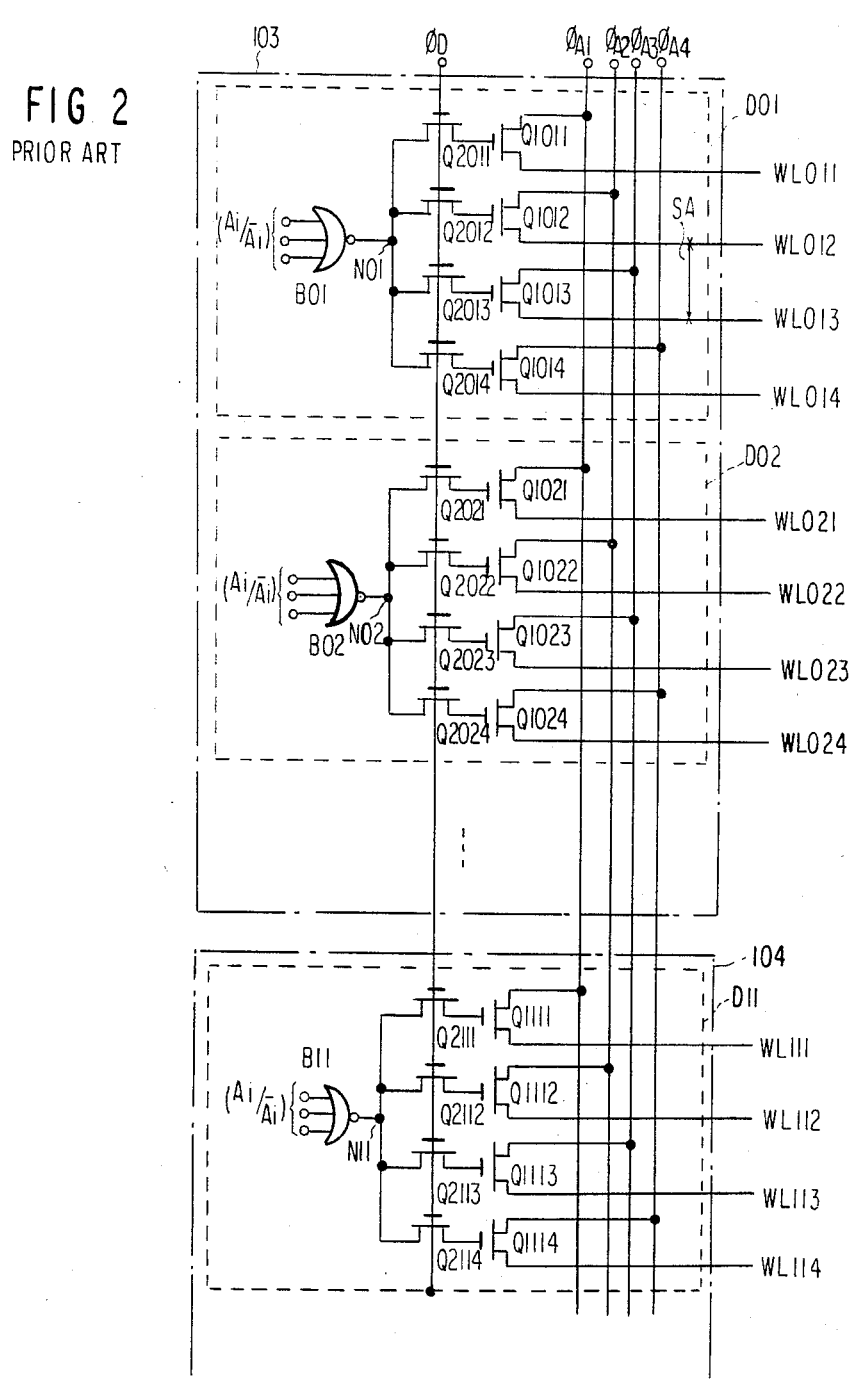
FIG. 2 an arrangement of word lines and decoders in a conventional memory matrix.

An example of the arrangement of decoders and word lines in a memory of 64K is shown in FIG. 2. The row selection circuit 103 shown in FIG. 1 is constituted by a plurality of row selection unit circuits $D_{01}$, $D_{02}$ . . . , and the row selection circuit 104 shown in FIG. 1 is similarly constituted by a plurality of row selection unit circuits $D_{11}$ . . . NOR gates $B_{01}$ to $B_{11}$ in the respective selection unit circuits constitute decoders, respectively. To each NOR gate, true and complementary address signals $A_0/\overline{A_0}$ . . . $A_i/\overline{A_i}$ . . . are fed in a predetermined combination to determine the selection of the unit circuits $D_{01}$ to $D_{11}$ . . . In this case, the decoder circuit (NOR) $B_{01}$ associated with the cell matrix 101 and the decoder circuit $B_{11}$ associated with the cell matrix 102 have the same combination of address signals. These corresponding decoder circuits constituted by NORs, respectively, are selected by the same address inputs to select the memory matrixes 101 and 102 each having a memory capacity of 32K bits, respectively. As a matter of course, other decoder circuit $B_{02}$ similarly has the corresponding decoder circuit associated with the matrix 102. Transistors $Q_{1011}$ to $Q_{1114}$ are driving transistors which are turned ON and OFF according to the "1" and "0" state of nodes $N_{01}$ to $N_{11}$, respectively. When the transistors are OFF, word lines $WL_{011}$ $WL_{114}$ connected to the respective transistors are in the "0" states of selection signals $\phi A_1$ to $\phi A_4$ are applied to the word lines $WL_{011}$ to $WL_{114}$, respectively. Only one of the selection signals $\phi A_1$ to $\phi A_4$ is "1", while the others are "0". Transistors $Q_{2011}$ to $Q_{2114}$ are decoupling transistors which have a signal $\phi_D$ fed to their gates to apply the states of the nodes $N_{01}$ to $N_{11}$ to the driving transistors $Q_{1011}$ to $Q_{1114}$, respectively. For example, if the decoder circuit $B_{01}$ is selected and the decoder circuit $B_{11}$ is also selected, the transistors $Q_{1011}$ to $Q_{1014}$, $Q_{1111}$ to $Q_{1114}$ are ON, and one of the selection signals $\phi_{A1}$ to $\phi_{A4}$ is brought to the "1" level, while the other signals are maintained at the "0" level. For example, if the signal $\phi_{A4}$ is at the "1" level, each of two word lines $WL_{014}$ and $WL_{114}$ is brought to the "1" level to read out 256 bits, respectively. When a plurality of word lines are led out from one decoder, the conventional physical arrangement of word lines on a memory matrix is such that the word lines coming out of the same decoder are arranged adjacent to each other. Such an arrangement causes a disadvantage in manufacturing a memory having the above-mentioned redundancy circuit or a "mostly good" memory.

There is an unignorable amount of failure due to short circuits between the adjacent word lines in a defective mode in which some memory cells are defective. In such a defective mode, the conventional arrangement causes a needlessly large number of word line failures. It is natural to consider that short circuits between the adjacent word lines have an equal probability between all the adjacent word lines. If it is assumed that short circuits occur with an equal probability, it is obvious that, in the conventional arrangement, ¾ of the short circuits occur between the adjacent four word lines led out from the same decoder. Assuming now that there is such a short circuit SA between the word lines $WL_{013}$ and $WL_{014}$, when the word line $WL_{013}$ is selected, the node $N_{01}$ is at the "1" level, so that the transistors $Q_{1011}$ to $Q_{1014}$ are ON. While the word line $WL_{113}$ is similarly selected, and hence the transistors $Q_{1111}$ to $Q_{1114}$ are also ON. Then, the word lines $WL_{013}$ and $QL_{014}$ are short-circuiting with each other, because the signal $\phi_{A3}$ is undesirably connected to the signal $\phi_{A4}$ via the transistor $Q_{1013}$—the word line $WL_{013}$—the word line $WL_{014}$—the transistor $Q_{1014}$. Consequently, the level of the signal $\phi_{A3}$ is lowered, while the signal $\phi_{A4}$ is raised, undesirably. Accordingly, signals having correct levels are not fed to the other pair of word lines $WL_{113}$ and $WL_{114}$, respectively. Hence, even cells connected to the word lines $WL_{113}$ and $WL_{114}$ are judged to be defective. The similar problem is encountered also when other word line $WL_{014}$ is selected. In saving such a defective mode with redundancy circuits, it is impossible to decide which is defective, one pair of word lines $WL_{013}$ and $WL_{014}$ or the other pair of word lines $WL_{113}$ and $WL_{114}$. Even if possible, since the ON/OFF states of the two transistors $Q_{1013}$ and $Q_{1014}$ are determined according to the state of the node $N_{01}$, it is not possible to turn ON one of the transistors and turn OFF the other. Accordingly, two pairs of redundancy circuits are required to save this defective mode. Also in a "mostly good" memory device, as a matter of course, the failure of one pair of word lines is judged to be the failure of two pairs of word lines. Therefore, such a saving method cannot be much effectively employed.

The invention is now described through an embodiment.

Figure 3:
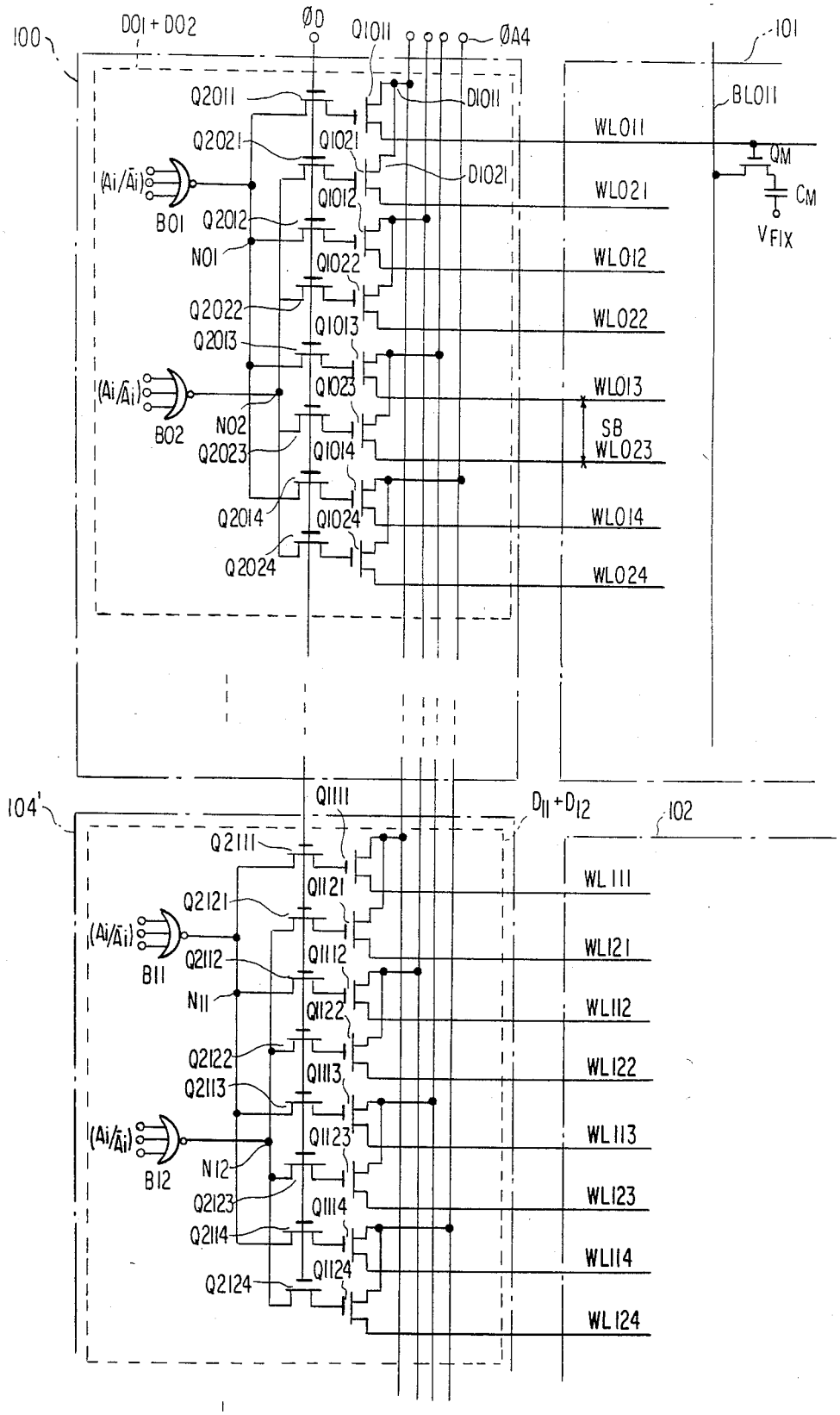
FIG. 3 shows an essential part of a memory matrix in accordance with an embodiment of the invention.

An embodiment of the invention will be explained hereinunder with reference to FIG. 3. The same elements or portions in FIG. 3 as those in FIG. 2 are denoted by the same reference numerals. The cell array 101 is constituted by memory cells each composed of a transistor $Q_M$ and a capacitor $C_M$ which is disposed at the intersections between word lines and bit lines $BL_{011}$ ... The cell array 102 is similarly constituted.

In this embodiment, the four word lines $WL_{011}$ to $WL_{014}$ and the four word lines $WL_{021}$ to $WL_{024}$ connected to the two adjacent unit circuits $D_{01}$ and $D_{02}$ in FIG. 2, respectively, are alternately arranged to form a unit circuit $D_{01}+D_{02}$. More specifically, in a selection circuit 103' corresponding to the selection circuit 103 in FIG. 1, the decoupling transistors $Q_{2011}$ to $Q_{2014}$ and driving transistors $Q_{1011}$ to $Q_{1014}$ which are connected to the decoder $B_{01}$ and the decoupling transistors $Q_{2021}$ to $Q_{2024}$ and driving transistors $Q_{1021}$ to $Q_{1024}$ which are connected to the decoder $B_{02}$ are alternately arranged.

With respect to every two adjacent unit circuits (not shown) subsequent to the unit circuits $D_{01}$ and $D_{02}$ in FIG. 2, similarly, the decoupling transistors and driving transistors and those which are connected to two decoders, respectively, are alternately arranged, and a word line is led out from each driving transistor.

Also in a selection circuit 104' corresponding to the selection circuit 104 in FIG. 1, the decoupling transistors $Q_{2111}$ to $Q_{2114}$ and driving transistors $Q_{1111}$ to $Q_{1114}$ which are connected to the decoder $B_{11}$ aw well as the word lines $WL_{111}$ to $WL_{114}$ which are connected to these driving transistors $Q_{1111}$ to $Q_{1114}$, and the decoupling transistors $Q_{2121}$ to $Q_{2124}$ and driving transistors $Q_{1121}$ to $Q_{1124}$ which are connected to the decoder $B_{12}$ as well as the word lines $WL_{121}$ to $WL_{124}$ which are connected to these driving transistors $Q_{1121}$ to $Q_{1124}$ are alternately arranged.

In this case, each of the decoders $B_{01}$ and $B_{02}$ ... in the selection circuit 103' and the corresponding one of the decoders $B_{11}$ and $B_{12}$ ... in the selection circuit 104' have the same address inputs fed thereinto, i.e., the combination of $A_i/A_i$ so as to perform the same operation. For example, when the decoder $B_{01}$ is in the selective state, the decoder $B_{11}$ is also in the selective state.

The operation of the memory device is as follows. After the state of each decoder is established, the control signal $\phi_D$ is brought to the "1" level to turn ON each decoupling transistor thereby to transmit the output of each decoder to the gates of the corresponding driving transistors. Then, by two bits of address signals, one of the selection driving signals $\phi_{A1}$ to $\phi_{A4}$ is brought to the "1" level, while the others are maintained at the "0" level, so that one word line is selected in each of the two memory arrays 101 and 102.

If there is a short circuit SB between two adjacent word lines $WL_{013}$ and $WL_{023}$ in the array 101, when the word line $WL_{013}$ is selected, the transistor $Q_{1013}$ is ON, but the transistors $Q_{1023}$ is OFF. Therefore, no current will flow between the selection signals $\phi_{A3}$ and $\phi_{A4}$. Hence, there is no possibility of any undesirable lowering of the signal $\phi_{A3}$ and any undesirable rise of the signal $\phi_{A4}$. In consequence, there is no adverse effect on the other word lines of the array 102 connected to the selection circuit 104' which are simultaneously selected, so that the number of word lines judged to be defective is prevented from becoming larger than two. Further, in case of employing redundancy circuits, it is only necessary to replace either one of the word lines $WL_{1013}$ and $WL_{1023}$. Accordingly, redundancy circuits can be effectively utilized.

Moreover, in the embodiment of the invention, the selection signals from the decoders $B_{01}$, $B_{02}$ are fed into the adjacent driving transistors $Q_{1011}$, $Q_{1021}$ ... Therefore, for example, drain regions $D_{1011}$ and $D_{1012}$ of the transistors $Q_{1011}$ and $Q_{1021}$ can be made common to each other, and only one contact is required for the signal $\phi_{A1}$, so that it is possible to make the chip area small than that of the conventional memory device.

Although in the described embodiment one decoder determines the selection of four word lines, it is obvious that the invention is effective for the case where the number of word lines allotted to the same decoder is plural.

Moreover, although in the above embodiment, with respect to every two decoders, the word lines connected to these two decoders are alternately arranged, it is also possible to alternately arrange word lines $WL_{A1}$ ..., $WL_{B1}$ ..., $WL_{C1}$ ... which are connected to three or more decoders $D_A$, $D_B$, $D_C$ ..., respectively, as follows: $WL_{A1}-WL_{B1}-WL_{C1}--WL_{A2}-WL_{B2}-WL_{C2}$ ...

I claim:

1. A semiconductor memory device, comprising:
   a plurality of first word lines;
   a plurality of second word line, said first word lines and said second word lines being interleaved in parallel;
   a plurality of bit lines intersecting with said word lines;
   a plurality of memory cells coupled between said word lines and said bit lines;
   a first decoding circuit;
   a second decoding circuit;
   a plurality of control signal terminals;
   means for operatively supplying one of said control signal terminals with a selection signal;
   a plurality of first driving transistors each coupled between one of said control signal terminals and one of said first word lines;
   first means for controlling said first driving transistors in response to an output of said first decoding circuit;
   a plurality of second driving transistors each coupled between one of said control signal terminals and one of said second word lines; and
   second means for controlling said second driving transistors in response to an output of said second decoding circuit;
   wherein every two adjacent word lines are assigned to different decoding circuits.

2. The memory device according to claim 1, in which said first means includes a plurality of first transfer gate transistors each coupled between the output of said first decoding circuit and a gate of associated one of said first driving transistors, and said second means includes a plurality of second transfer transistors each coupled between the output of said second decoding circuit and a gate of associated one of said second driving transistors.

3. The memory device according to claim 1, in which one of said first driving transistors and one of said second transistors both connected to the adjacent first and second word lines are commonly connected to the same control signal terminal.

4. The memory device according to claim 1, in which each of said first and second decoding circuits includes a NOR circuit receiving address signals.

5. A semiconductor memory device, comprising
a first number M (M being an integer of two or more) of decoding circuit;
a second number N (N being an integer of two or more) of selection lines,
a third number MxN of word lines arranged in parallel; wherein said word lines are classified into N word line groups each including N word lines, a third number MxN of driving transistors, said driving transistors are classified into M transistors groups each including N of driving transistors, one of the driving transistors in each transistor group is electrically coupled between one of the word lines of one of said word line group and one of said selection lines, all the driving transistors in one of said driving transistor group are controlled by one of said decoding circuits, the word lines of one word line group are assigned to one of said decoding circuits and the word lines of at least one other word line group are assigned to at least one other decoding circuit topographically adjacent to said one decoding circuit being interleaved one after the other while the word lines of the same word line group are never adjacent to each other in the topographical relation,
said device further comprising a plurality of bit lines,
a plurality of memory cells coupled between said word lines and said bit lines,
and means for selectively energizing one of said selection lines.

6. The memory device according to claim 5, in which said selection lines are coupled to drains of said driving transistors.

7. The memory device according to claim 5, in which the gate of each of said driving transistors is connected to one of said decoding circuits via a drain-source path of a transfer gate transistor.

8. A semiconductor memory device, comprising a plurality of memory arrays, each of said memory arrays including:
a plurality of word lines arranged in parallel, said word lines being classified into a plurality of word line groups;
a plurality of bit lines;
a plurality of memory cells;
a plurality of decoder circuits each provided for each one of said word line groups;
a plurality of driving transistor groups each provided for each one of said word line groups, each of said driving transistor groups including the same number of driving transistors as the number of the word lines in each word line group, the driving transistors of each driving transistor group being coupled between said selection lines and the word lines of the associated word line group;
means for operatively supplying one of said selection lines with a selection signal; and
a plurality of control means each provided for each one of said decoder circuits and one of said driving transistor groups, each of said driving transistors driving the word line coupled thereto when the associated decoder circuit is selected and the associated selection line is supplied with the selection signal therefrom, the word lines of one word line group assigned to one decoder circuit and the word lines of another word line group assigned to another decoder adjacent to said one decoder circuit are interleaved one with the other in topographical relation, the selection lines are electrically common through said plurality of memory arrays, and every two or more consecutively arranged word lines are assigned to different decoder circuits.

9. The memory device according to claim 8, in which each of said control means includes a plurality of transfer gate transistors coupled between the output of the associated decoding circuit and the associated set of driving transistors.

10. The memory device according to claim 8, in which said plurality of memory arrays operate in parallel.

11. A semiconductor device, comprising:
a plurality of drive lines, said drive line being classified into a plurality of drive line groups each including a plurality of drive lines;
a plurality of decoding circuits each provided for each of said drive line groups;
a plurality of selection terminals;
a plurality of driving transistors, said driving transistors being classified into a plurality of transistor groups each provided for each of said drive line groups, each one of the driving transistors in each transistor group being electrically coupled between one of the drive line in each drive line group and one of said selection terminals, all the driving transistors in one of said transistor group being controlled by one of said decoder circuits, each one of the drive lines of one drive line group assigned to one of said decoding circuits being located, in topographical relation, adjacent to each one of the drive lines of at least one other drive line group assigned to at least one other decoding circuit adjacent to said decoding circuit; and
means for selectively energizing said selection terminal;
wherein at least every two or more adjacent drive lines in the topography are assigned to different decoder circuits.

12. The device according to claim 11, wherein each of said driving transistors has a drain-source path coupled between one of said selection lines and one of said drive lines.

13. The device according to claim 11, wherein a gate of each of said driving transistor is connected to an output of the associated decoder circuit via a transfer gate.

* * * * *

UNITED STATES PATENT AND TRADEMARK OFFICE
CERTIFICATE OF CORRECTION

PATENT NO. : 4,584,674

DATED : November 6, 1985

INVENTOR(S) : Hiroshi Watanabe

It is certified that error appears in the above-identified patent and that said Letters Patent is hereby corrected as shown below:

Column 1, line 68, after "the increase have" delete "have".

Column 2, line 1, after "been in the storage" delete "been".

Column 3, line 20, change "FIG. 2 an arrangement" to --FIG. 2 shows an arrangement--;

line 57, change "$A_0/A_0......A_i/A_i$" to --$A_0/\overline{A_0}....A_i/\overline{A_i}$--.

Column 5, line 45, change "$A_i/A_i$ so" to --$A_i/\overline{A_i}$ so--.

Signed and Sealed this

Eighteenth Day of November, 1986

*Attest:*

DONALD J. QUIGG

*Attesting Officer*  *Commissioner of Patents and Trademarks*